(12) United States Patent
Witty et al.

(10) Patent No.: US 7,918,381 B2
(45) Date of Patent: Apr. 5, 2011

(54) PROCESS FOR ATTACHING COMPONENTS WITH NEAR-ZERO STANDOFF TO PRINTED CIRCUIT BOARDS

(75) Inventors: Michael R. Witty, Yorktown, IN (US); David W. Ihms, Russiaville, IN (US); Joel D. Hunt, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 1273 days.

(21) Appl. No.: 11/287,841

(22) Filed: Nov. 28, 2005

(65) Prior Publication Data

US 2007/0119910 A1    May 31, 2007

(51) Int. Cl.
*B23K 31/00* (2006.01)

(52) U.S. Cl. .................................... 228/179.1; 438/119

(58) Field of Classification Search ............... 228/179.1; 438/119
See application file for complete search history.

(56) References Cited

U.S. PATENT DOCUMENTS

| 3,439,235 | A | * | 4/1969 | Lanzl et al. | 257/793 |
| 5,953,814 | A | * | 9/1999 | Sozansky et al. | 29/840 |
| 2003/0096453 | A1 | * | 5/2003 | Wang et al. | 438/108 |

* cited by examiner

*Primary Examiner* — Jessica L Ward
*Assistant Examiner* — Nicholas P D'Aniello
(74) *Attorney, Agent, or Firm* — Jimmy L. Funke

(57) ABSTRACT

The present invention relates to a method and apparatus for mounting electrical components to electric circuit boards. Specifically, the present invention relates to a method for mounting electrical components having near-zero standoff height to electrical printed circuit boards.

13 Claims, 5 Drawing Sheets

PROCESS FOR ATTACHING COMPONENTS WITH NEAR-ZERO STANDOFF TO PRINTED CIRCUIT BOARDS

TECHNICAL BACKGROUND

The present invention relates to a method and apparatus for mounting electrical components to electric circuit boards. Specifically, the present invention relates to a method for mounting electrical components having near-zero standoff height to electrical printed circuit boards.

BACKGROUND OF THE INVENTION

Electrical printed circuit boards (PCBs) such as those used in cell phones and computers include a variety of electrical components such as analog signal mixing components, duplexers, monolithic resistors, capacitor elements, or silicon "flip chips" that are soldered or anchored to the surface of the PCB. These electrical components attached to the surface of the PCB cooperate with the integrated circuits of the PCB to form a variety of circuits configured to perform a variety of functions. Occasionally, the solder joints used to anchor the electrical components to the PCB may become fractured due to excessive mechanical stress attributed to the relative difference in the coefficient of thermal expansion (CTE) of the electrical component and the underlying PCB substrate. If the solder joint becomes fractured, the performance of the circuit may become impaired or completely non-functional. The coefficient of thermal expansion of common PCBs composed of a fibreglass-reinforced organic substrate (e.g., FR4) is generally less than 20 ppm/° C. (parts per million/° Celsius) whereas the coefficient of thermal expansion of common electrical ceramic components, such as a duplexer, is generally less than 6 ppm/° C. Mechanical sheer stress may be generated by many excursions over a fixed temperature range over a period of time. The effects of excessive sheer stress may be manifested as a fractured electrical component, a fractured PCB, or, commonly, a fractured solder joint. Silicon "flip chips" and monolithic ceramic signal mixing components assembled onto organic FR4 printed circuit board substrates may be particularly susceptible to thermal and mechanical stresses that may cause fractured solder joints. Fatigue resistance of solder joints may be further compromised when the overall footprint, or surface area, of the signal mixing component increases or when the solder joint standoff height decreases. The standoff height is the gap or distance between the upper surface of the PCB and the lower surface of the electrical components.

SUMMARY OF THE INVENTION

A common counter-measure for mechanically induced solder fatigue is void-free lead encapsulation and complete electrical component underfill with an epoxy material having a controlled coefficient of thermal expansion. Most high performance CTE-controlled thermosetting epoxy materials designed for underfill applications are designed to flow through gaps in the range of 0.15 to 0.25 millimeters (0.006 to 0.010 inches). In applications in which the standoff height is less than 0.15 millimeters (0.006 inches) epoxy materials generally do not completely underfill the electrical component. The invention involves heating the epoxy materials to facilitate capillary action so the epoxy fills the smaller standoff height.

One method of the present invention includes a method of supporting an electrical component coupled to a surface of a circuit board including a plurality of electrical circuits, the electrical component coupled to the surface by a solder standoff having a height less than about 0.15 millimeters, the electrical component defining a perimeter, the method comprising the steps of providing an epoxy material, heating the epoxy material, heating the circuit board, applying the epoxy material to the surface at a position adjacent to the perimeter of the electrical component, waiting for a predetermined time period, and curing the epoxy material applied to the surface of the circuit board.

Another method of the present invention includes a method of filling a gap defined between an electrical component and a circuit board, the electrical component coupled to the circuit board by at least one solder joint, the gap being less than about 0.15 millimeters, the method comprising the steps of providing an epoxy material, heating the circuit board, applying the epoxy material to the gap, waiting for a predetermined time period, and curing the epoxy material applied to the gap.

One embodiment of the present invention includes a circuit board comprising a plurality of electrical circuits, an electrical component coupled to the circuit board by a solder standoff having a height less than about 0.15 millimeters, the electrical component defining an outer perimeter, and an epoxy material positioned between the circuit board and the electrical component around the outer perimeter of the electrical component.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

Figure 1:
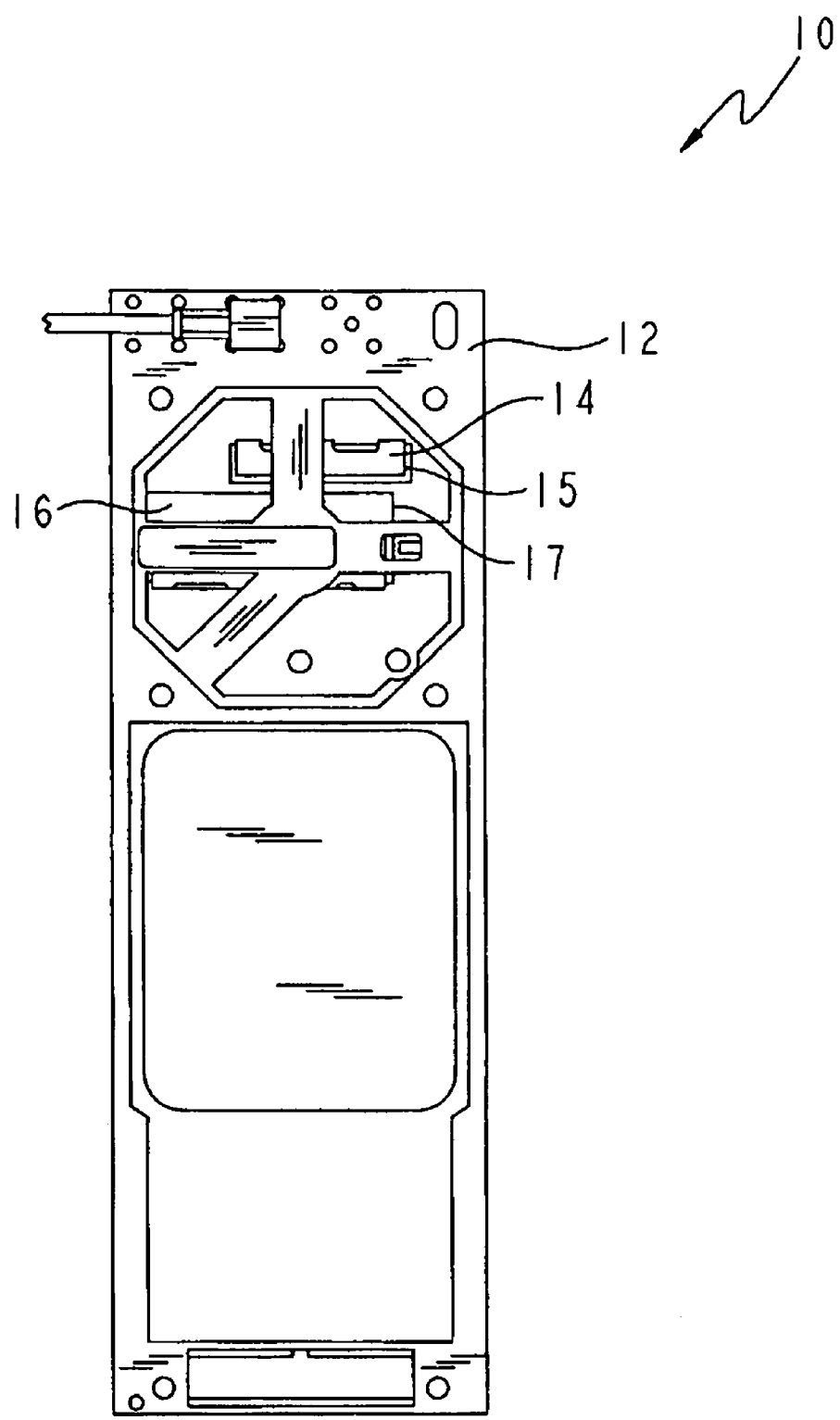
FIG. 1 is a top view of a wireless phone module.
Figure 2:
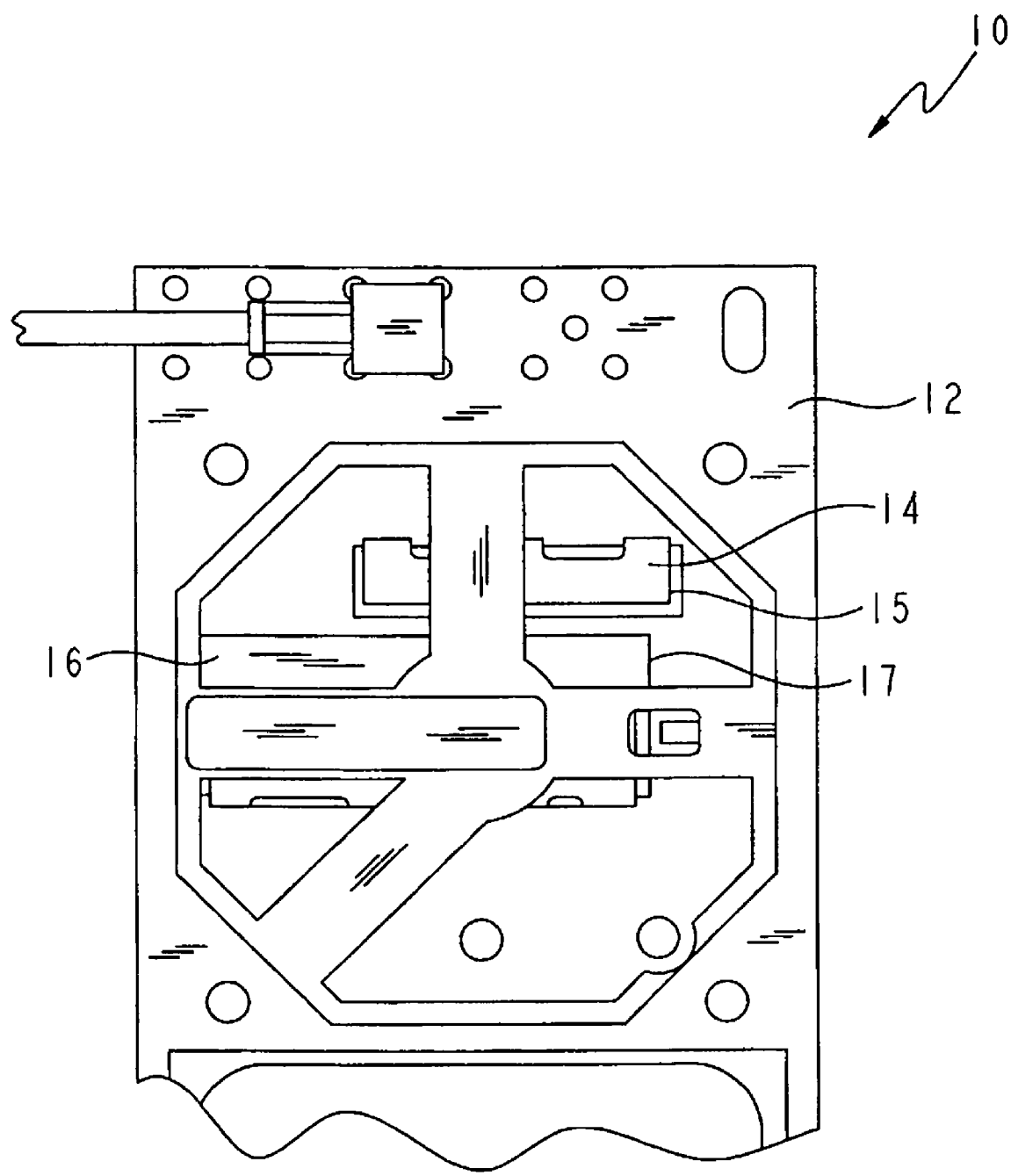
FIG. 2 is a partial schematic view of the electrical components of the phone module shown in FIG. 1.

Corresponding reference characters indicate corresponding parts throughout the several views. Although the drawings represent embodiments of the present invention, the drawings are not necessarily to scale and certain features may be exaggerated in order to better illustrate and explain the present invention. The exemplifications set out herein illustrate embodiments of the invention in several forms and such exemplification is not to be construed as limiting the scope of the invention in any manner.

DESCRIPTION OF INVENTION

The embodiments discussed below are not intended to be exhaustive or limit the invention to the precise forms disclosed in the following detailed description. Rather, the embodiments are chosen and described so that others skilled in the art may utilize their teachings.

Referring to FIG. 1, a Sony Ericsson CM42 wireless phone module is shown. An example of the method of the present invention will be described using module 10 as shown in FIG. 1. It should be understood that module 10 is only a representative example and that the method of the present invention may be practiced on any suitable electric circuit board having electrical components soldered thereto. Module 10 includes printed circuit board 12 and duplexers 14 and 16. Duplexers 14 and 16 are soldered to PCB 12 and interact with printed circuits integrated into the surface of PCB 12. Each of the duplexers 14, 16 define an outer perimeter 15, 17, respectively. As discussed above, solder joints are used to electrically couple duplexers 14 and 16 to circuit board 12.

The first step of the method of the present invention includes heating or baking the selected epoxy material in an atmospheric or nitrogen-inerted operation. This pre-bake operation eliminates any surface moisture that may interfere with the adhesive properties of the epoxy material when it bonds to the PCB and the electrical component surfaces. For this embodiment, the nominal pre-bake temperature is about 150° C. and the minimum pre-bake time period is about 15 minutes. The time period between dispensing the epoxy material and the pre-heat operation is limited to 60 minutes for this embodiment. Exposure to atmospheric conditions prior to the step of dispensing the epoxy material, discussed below, may quickly re-hydrate the surface of the epoxy material. The result may be a loss of adhesion and thus a loss of mechanical protection against excessive shear stress on the solder joints. It should be noted that the pre-heat operation and parameters are dependent on the epoxy material chosen for the application. For some epoxy materials, the step of pre-heating may require different pre-heat parameters or the step of pre-heating may be unnecessary.

The next step of the method of the present invention is to heat PCB 12. In this embodiment, PCB 12 of module 10 is pre-heated to a temperature of approximately 75° Celsius to increase the flow rate of an epoxy material that will be added later and improve the cycle time of the encapsulation process. Heating may be achieved by contact to a hot plate or any other suitable method. Preferably the temperature must be sufficient to improve flow the epoxy material yet low enough to prevent rapid gelling or striation in the epoxy material.

Figure 3:
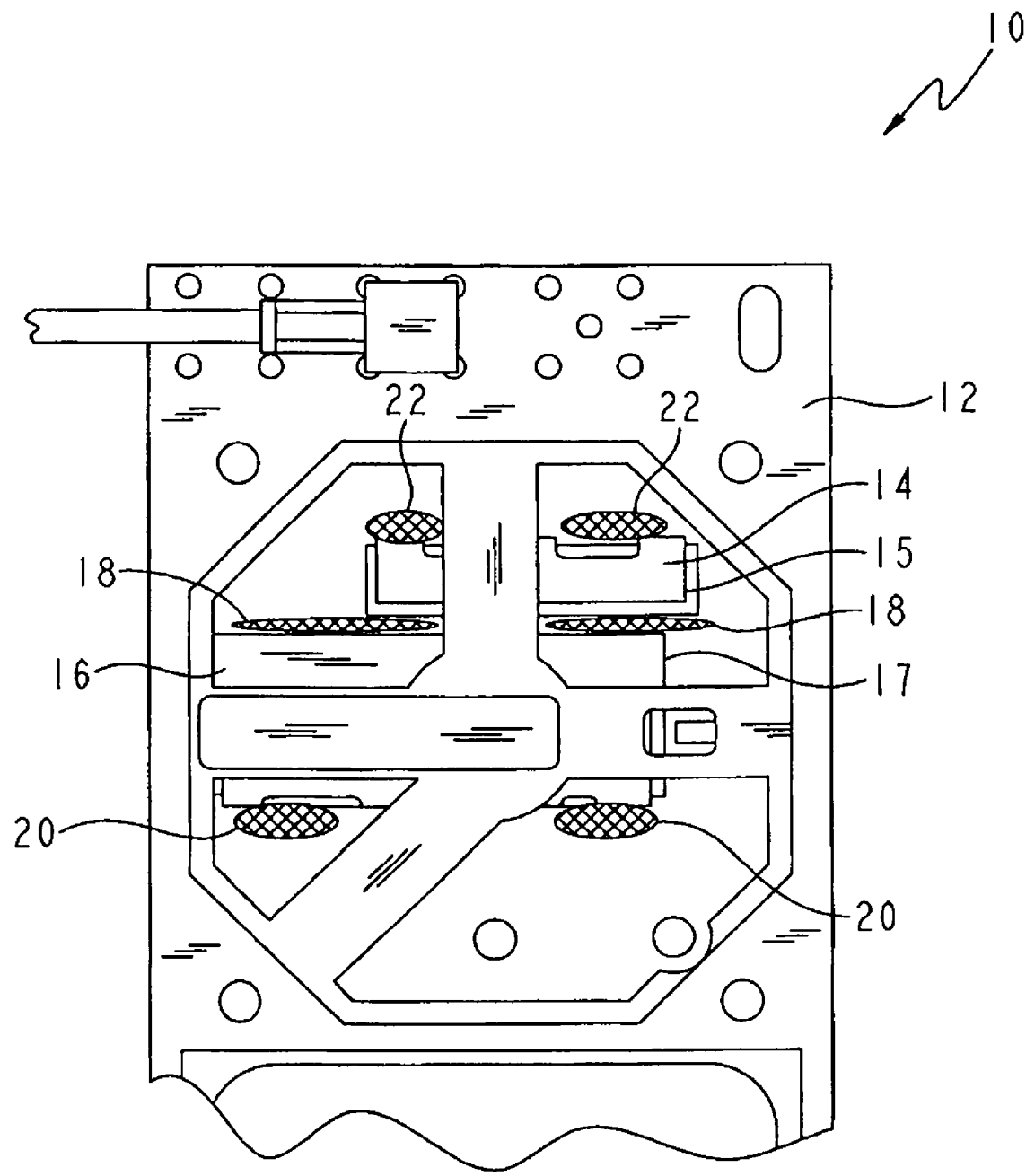
FIG. 3 is a top view of the electrical components of the phone module shown in FIG. 2 after epoxy material has been positioned on the phone module.
Figure 4:
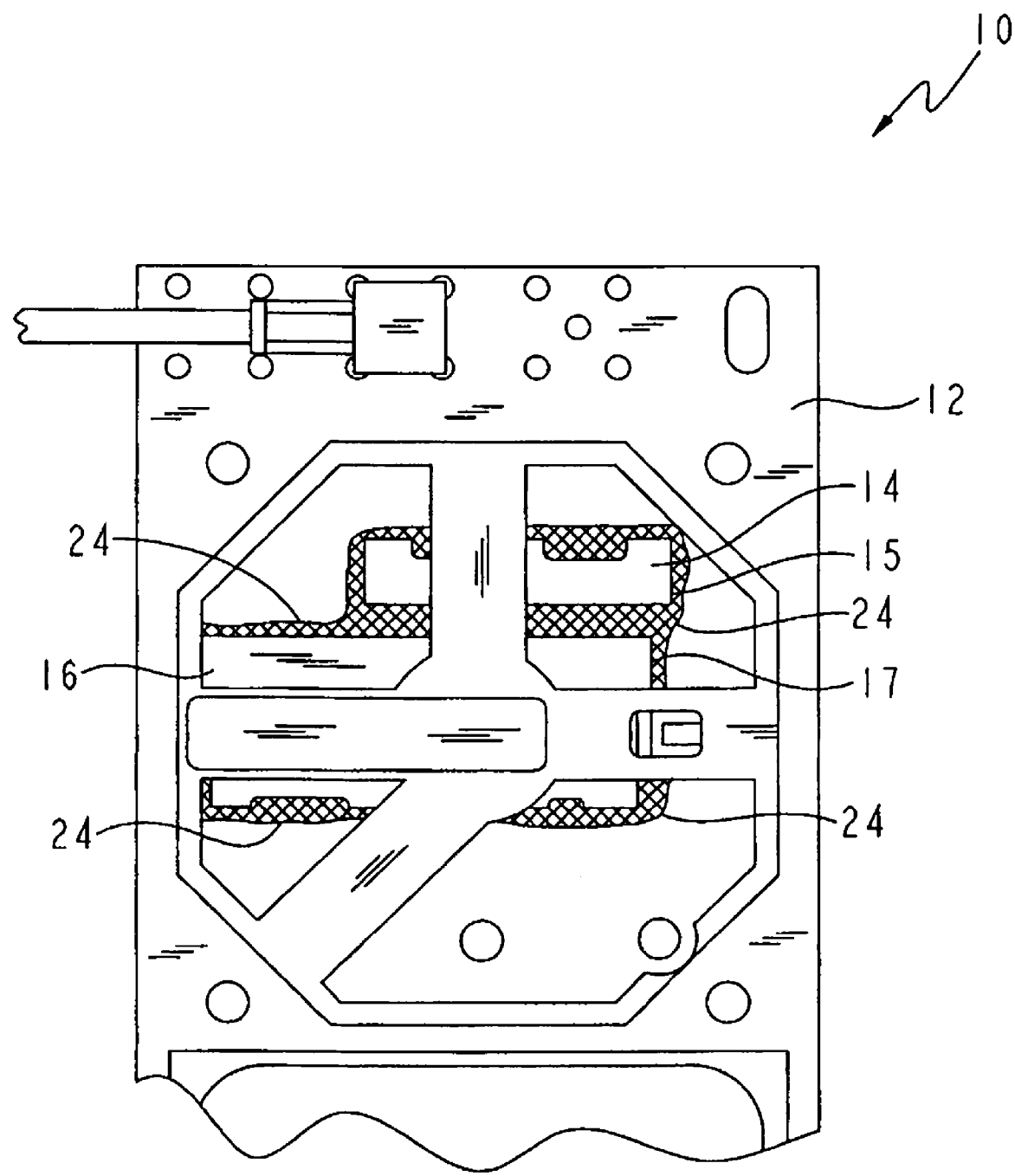
FIG. 4 is a top view of the electrical components of the phone module shown in FIG. 3 after a predetermined time period has elapsed to allow the epoxy material to flow around the electrical components.

Referring now to FIG. 3, epoxy material is applied to PCB 12 at positions 18, 20, and 22 around the outer perimeters 15 and 17 of duplexers 14 and 16. In this embodiment, epoxy material is dispensed along the outside edges of the long axis of each duplexer 14 and 16. Capillary action allows epoxy material 24 to wick around the outer perimeters of the duplexers 14 and 16 to form a perimeter fillet around each duplexer, as shown in FIG. 4. Application of epoxy material 24 is discussed below and in FIGS. 5-7. It should be understood the method of the present invention is not limited to dispensing epoxy material 24 at positions 18, 20, and 22. Factors such as the shape of the electrical component, the layout of components on the PCB, and other factors may be used to determine the appropriate positions for dispensing the epoxy material.

The next step in the method of the present invention is to wait a predetermined time period, for example 60 seconds, to allow epoxy material 24 to completely encapsulate and anchor duplexers 14, 16. Epoxy material 24 may be dispensed manually by hand, by a vision-controlled, positive displacement liquid dispense system, or any other suitable method.

The next step in the method of the present invention is curing epoxy material 24 in an atmospheric or nitrogen-inerted convection oven or other suitable device. In this example, the oven temperature was 150° C. and the cure time period was between 15 minutes and 8 hours. The time period between dispensing epoxy material 24 and curing was about 60 minutes. It should be understood that the step of curing the epoxy material is dependent upon the epoxy material chosen. The curing process may not be necessary or the heating requirements may vary depending on the epoxy material chosen.

The dispense pattern of epoxy material 24 should not physically interfere or damage other components of module 10. In this embodiment, epoxy material 24 is pre-heated at a temperature of about 150° Celsius for a minimum of 15 minutes and a maximum of 8 hours. As discussed above, the step of pre-heating the epoxy material may not be necessary and is dependent upon the epoxy material chosen for the encapsulation process. The maximum amount of time between epoxy pre-bake and dispensing of epoxy material is preferably 60 minutes or less. In this embodiment, the total weight of epoxy material 24 dispensed is about two hundred and sixty milligrams plus or minus twenty-five milligrams. For this example, the needle size for dispensing epoxy material 24 is twenty-two gauge (outer diameter equals 0.03 inches, internal diameter equals 0.017 inches). The needle should not contact the edge of the duplexers. The distance between the needle and circuit board 12 during the application of epoxy material 24 should be less than 1.52 millimeters (0.060 inches).

Examples of suitable low viscosity thermosetting epoxy material include U8431L from Namic Corporation and CircuitSAF™ ME-525 from LORD Corporation, however any other suitable epoxy material may be used.

Figure 5:
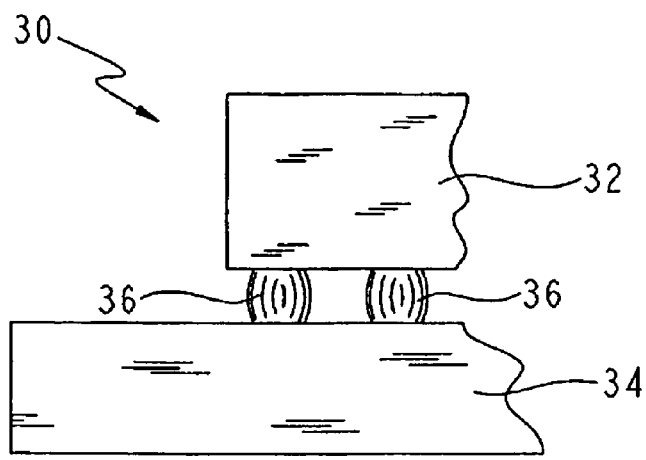
FIG. 5 is a partial side view of an electrical component soldered to a printed circuit board.
Figure 6:
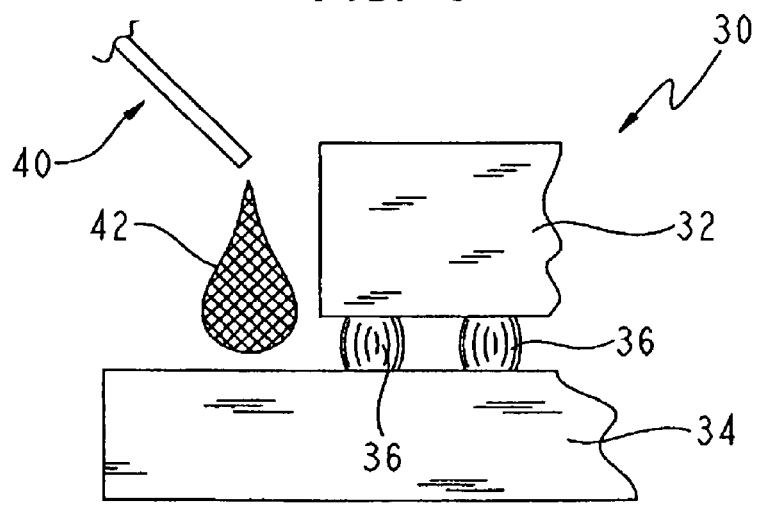
FIG. 6 is a partial side view of the printed circuit board and electrical component shown in FIG. 5 including the placement of an epoxy material on the surface of the printed circuit board.
Figure 7:
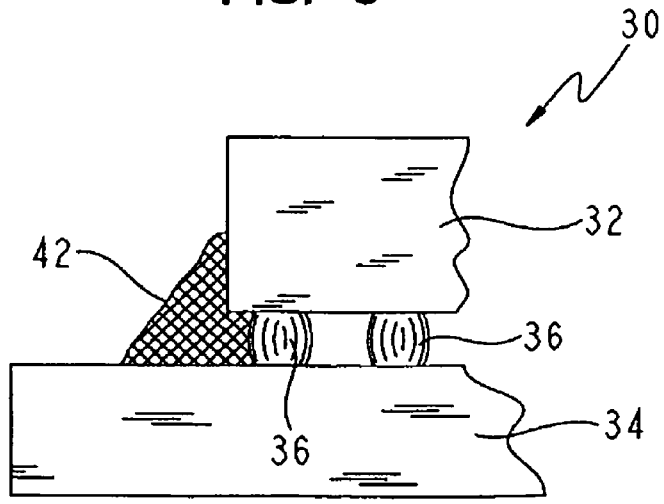
FIG. 7 is a partial side view of the printed circuit board and electrical component of FIG. 6 after a predetermined time period during which the epoxy material has filled the void between the electrical component and printed circuit board.

Referring now to FIGS. 5-7, a module 30 including a PCB 34 including an electrical component 32 is shown. Electrical component 32 is coupled to PCB 34 by solder standoffs 36. In FIG. 6, an example of the step of applying epoxy material is shown. Needle 40 is positioned adjacent PCB 34 and electrical component 32 epoxy material 42 is applied. As shown in FIG. 7, epoxy material 42 wicks or flows into the gap between the lower surface of electrical component 32 and the upper surface of PCB 34. As discussed above, most epoxy materials are not configured to completely underfill electrical components having standoff heights less than about 0.15 millimeters. The encapsulation method of the present invention may be used to enhance the reliability of solder joints on printed circuit boards having components soldered thereto with standoff heights less than about 0.15 millimeters.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

The invention claimed is:

1. A method of supporting an electrical component coupled to a surface of a circuit board including a plurality of electrical circuits, the electrical component coupled to the surface by a solder standoff having a height less than about 0.15 millimeters, the electrical component defining a perimeter, the method comprising the steps of:
   providing an epoxy material;
   heating the epoxy material to eliminate moisture and to facilitate capillary action so the epoxy material fills the standoff;
   heating the circuit board;

applying the heated epoxy material to the surface at a position adjacent to the perimeter of the electrical component;

waiting for a predetermined time period; and curing the epoxy material applied to the surface of the circuit board.

2. The method of claim 1, wherein the step of curing the epoxy material includes exposing the epoxy material applied to the surface of the circuit board to one of an atmospheric convection oven and a nitrogen-inerted convection oven.

3. The method of claim 1, wherein the predetermined time period is at least 60 seconds.

4. The method of claim 1, wherein the step of waiting for the predetermined time period is sufficient to facilitate the wicking of the epoxy material around the perimeter of the electrical component.

5. The method of claim 1, wherein the circuit board is heated to about 75° C.

6. The method of claim 1, wherein the epoxy material is heated before being applied to the surface of the circuit board.

7. The method of claim 1, wherein the electrical component is one of a duplexer, a monolithic resistor, a capacitor element, a silicon flip chip, and an electrical circuit element that may be susceptible to fractured solder joints due to effects of excessive shear stress.

8. A method of filling a gap defined between an electrical component and a circuit board, the electrical component coupled to the circuit board by at least one solder joint, the gap being less than about 0.15 millimeters, the method comprising the steps of:

providing an epoxy material;

heating the epoxy material to eliminate moisture and to facilitate capillary action so the epoxy material fills the standoff;

heating the circuit board;

applying the heated epoxy material to the gap;

waiting for a predetermined time period; and curing the epoxy material applied to the gap.

9. The method of claim 8, wherein the circuit board is heated to about 75° C.

10. The method of claim 8, wherein the step of curing the epoxy material includes exposing the epoxy material applied to the surface of the circuit board to one of an atmospheric convection oven and a nitrogen-inerted convection oven.

11. The method of claim 8, wherein the step of waiting for the predetermined time period is sufficient to facilitate the wicking of the epoxy material into the gap.

12. The method of claim 11, wherein the electrical component defines an outer perimeter and the epoxy material fills the gap adjacent to the outer perimeter.

13. The method of claim 8, wherein the epoxy material is heated before being applied to the gap.

* * * * *